United States Patent
Jiang et al.

(10) Patent No.: US 6,184,064 B1
(45) Date of Patent: Feb. 6, 2001

(54) SEMICONDUCTOR DIE BACK SIDE SURFACE AND METHOD OF FABRICATION

(75) Inventors: Tongbi Jiang; Chad A. Cobbley, both of Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/481,947

(22) Filed: Jan. 12, 2000

(51) Int. Cl.$^7$ .................................................. H01L 21/44
(52) U.S. Cl. ........................ 438/113; 438/665; 438/459; 438/964; 257/739
(58) Field of Search ........................................ 438/113, 114, 438/124, 123, 126, 127, 665, 459, 464, 928, 964; 257/739

(56) References Cited

U.S. PATENT DOCUMENTS

| | | |
|---|---|---|
| 3,905,162 | 9/1975 | Lawrence et al. . |
| 4,587,771 | 5/1986 | Buchner et al. . |
| 4,756,968 | 7/1988 | Ebe et al. . |
| 4,782,029 * | 11/1988 | Takemura et al. ................... 438/472 |
| 5,197,271 | 3/1993 | Robbins et al. . |
| 5,223,734 * | 6/1993 | Lowrey ................................. 257/401 |
| 5,242,862 * | 9/1993 | Okabe et al. ......................... 438/964 |
| 5,313,102 | 5/1994 | Lim et al. . |
| 5,504,022 * | 4/1996 | Nakanishi et al. ................... 438/965 |
| 5,554,569 * | 9/1996 | Ganesan et al. ..................... 438/964 |
| 5,583,372 | 12/1996 | King et al. . |
| 5,618,227 | 4/1997 | Tsutsumi et al. . |
| 5,622,875 * | 4/1997 | Lawrence ............................. 438/691 |
| 5,632,667 | 5/1997 | Earl et al. . |
| 5,643,044 | 7/1997 | Lund . |
| 5,753,535 * | 5/1998 | Ebihara ................................ 438/123 |
| 5,756,380 | 5/1998 | Berg et al. . |
| 5,773,362 * | 6/1998 | Tonti et al. .......................... 438/964 |
| 5,780,204 | 7/1998 | La et al. . |
| 5,827,111 | 10/1998 | Ball . |
| 5,836,807 | 11/1998 | Leach . |
| 5,851,664 | 12/1998 | Bennett et al. . |
| 5,864,174 * | 1/1999 | Yamada et al. ..................... 438/123 |
| 5,930,603 * | 7/1999 | Tsuji et al. .......................... 438/127 |
| 5,989,971 * | 11/1999 | Tu et al. ............................. 438/964 |
| 6,027,659 * | 2/2000 | Billett ................................. 438/691 |

OTHER PUBLICATIONS

Amagai, Masazumi et al. Cracking Failures in Lead–On–Chip Packages Induces by Chip Backside Contamination, IEEE Transactions on Components, Packaging, and Manufacturing Technology—Part B, vol. 18, No. 1, Feb. 1995.

* cited by examiner

Primary Examiner—Kevin M. Picardat
(74) Attorney, Agent, or Firm—Trask Brett

(57) ABSTRACT

A method of physically altering the backside surface of a semiconductor wafer or other substrate, and resulting article, to improve adhesion between the backside surface of semiconductor dice singulated from the wafer and a die attach adhesive or encapsulation compound. The physically altered backside surface reduces or substantially eliminates delamination and cracking damage in a semiconductor die assembly due to semiconductor wafer tape contamination and subsequent moisture penetration. The physically altered backside surface further reduces both semiconductor wafer tape contamination and shear stress along the interface between the semiconductor die backside surface and the die attach adhesive or encapsulation compound.

37 Claims, 7 Drawing Sheets

SEMICONDUCTOR DIE BACK SIDE SURFACE AND METHOD OF FABRICATION

BACKGROUND OF THE INVENTION

1. Field of the Invention

The present invention relates to a method and apparatus for patterning, shaping and/or altering the backside surface of a semiconductor die. The present invention improves adhesion between a back side surface of a semiconductor die and either a die attach adhesive or encapsulation compound, reduces adhesive contamination from semiconductor wafer tape used in wafer processing, and reduces shear stress along the interface between the semiconductor die back side surface and either the die attach adhesive and/or encapsulation compound.

2. State of the Art

In a typical integrated circuit manufacturing process, a plurality of sets of integrated circuit patterns are simultaneously formed in discrete locations on a surface of a semiconductor wafer by a series of layer deposition and etching processes, as known in the art. Each set of the integrated circuit patterns is generally formed in a series of rectangular formats on a surface of the semiconductor wafer. Each set of integrated circuit patterns is separated from another set of integrated circuit patterns on the surface of the wafer by an area located therebetween where no integrated circuits or circuits are located on the surface of the wafer. Such an area separating each set of integrated circuits on the surface of the wafer being generally referred to as a "street area" on the surface of the wafer. After the sets of integrated circuit patterns are fully formed, the semiconductor wafer is diced by a wafer sawing machine, as known in the art, along the street areas of the semiconductor wafer separating the semiconductor wafer into a plurality of individual semiconductor dice having a plurality of integrated circuits. These individual semiconductor dice can then either be packaged within protective packages or incorporated into appropriate electronic circuits as unpackaged, or "bare", semiconductor die.

The term "semiconductor wafer" is used herein to denote any solid semiconductor surface, such as is provided by a silicon, gallium arsenide or indium phosphide wafer sliced transversely from a crystal ingot, or a layer of such semiconductor material formed on glass, ceramic, sapphire, or other supporting carrier, as known in the art.

Once a semiconductor wafer has been sliced or otherwise formed, such as being sawed from a crystal ingot, a surface of the semiconductor wafer may undergo a rough polish followed by chemical-mechanical polishing process ("CMP process") to free the surface of irregularities and/or saw damage for the subsequent formation of the integrated circuit patterns thereon. Rough polishing of a surface of the semiconductor wafer generally includes an abrasive, slurry lapping process, as known in the art. The CMP process used after a rough polish of a surface of the wafer includes a combination of chemical etching and mechanical buffing wherein a mild etchant solution is flooded over the semiconductor wafer forming a thin etched chemical layer of a surface of the semiconductor wafer that is removed by the mechanical buffing action. The combination of the rough polish followed by CMP process results in a mirror-like finish on a surface of the semiconductor wafer. The term "mirror-like finish" is generally defined as a semiconductor wafer surface flatness value typically ranging from 3 to 4 $\mu$m as measured by the maximum peak-to-valley deviation of a semiconductor wafer surface from a reference plane extending thereover.

Generally, semiconductor wafers are initially sliced or otherwise fabricated having a thickness greater than is desired for a finished integrated circuit semiconductor die formed therefrom. A thick semiconductor wafer is more robust, which minimizes warpage and breakage that can result from various heating processes, as well as other processes, during the formation of the integrated circuit patterns for the semiconductor dice on a polished surface of the semiconductor wafer.

However, the thick semiconductor wafer is typically thicker than is desired for packaging of the individual semiconductor die, or too thick for use with processing equipment and fixtures in subsequent semiconductor die processing and/or encapsulation steps. Therefore, it is usually necessary, after the integrated circuit patterns are defined on the polished surface of the semiconductor wafer, to grind or otherwise remove a portion of the back side surface of the semiconductor wafer (i.e., the side opposite to the polished surface having a mirror-like finish of the semiconductor wafer) in order to reduce the semiconductor wafer thickness prior to the semiconductor wafer being diced into individual semiconductor die. Suitable grinding, sawing machines, and other processes and equipment for removing excess wafer depth on the semiconductor wafer back side surface are well known in the art.

To prevent movement of portions of the semiconductor wafer during the sawing process used to form individual semiconductor dice, a piece of semiconductor wafer tape is temporarily secured to the back side surface of the semiconductor wafer. Semiconductor wafer tape typically comprises an adhesive, a base film, and a release liner. The semiconductor wafer tape typically has a thickness in the range of about 5 to 15 $\mu$m. The semiconductor wafer tape adhesive is typically composed of five components: a base polymer, a cross-linking agent, an oligomer, a photoinitiator, and an additive agent. The base polymer comprises the main structural element of the adhesive of the semiconductor wafer tape. The oligomer serves to adjust the adhesive strength and hardness of the adhesive, so that an individual integrated circuit semiconductor die can be easily removed from the semiconductor wafer tape. The cross-linking agent is designed to enhance the cohesion of the adhesive of the semiconductor wafer tape. The photoinitiator enhances the degree of bonding by creating radicals during exposure to UV radiation after the semiconductor wafer tape is applied to the back side surface of the semiconductor wafer. Lastly, the additive agent acts to modify the strength of the adhesive of the semiconductor wafer tape independently of the oligomer. After application to the back side of the semiconductor wafer, the semiconductor wafer tape is exposed to ultraviolet radiation to trigger a chemical reaction to render the tape adhesive. (See, M. Amagai, et al., "*Cracking Failures in Lead-On-Chip Packages Induced by Chip Back side Contamination*", IEEE Transactions On Components, Packaging And Manufacturing Technology, Part B, Vol. 18, No. 1, pp. 119–126 (1995) (hereinafter "the Amagai article")).

After sawing the semiconductor wafer to form individual semiconductor die, the individual, or "singulated", semiconductor dice are removed from the semiconductor wafer tape. Although the taping of the semiconductor wafer is necessary, it results in adhesive and/or residues (primarily base polymer, oligomer, and additives) remaining on the back side of each of the individual semiconductor dice. These contaminants (adhesive and/or residues) affect the quality of the bond between the individual semiconductor die and an encapsulation compound (such as an epoxy molding resin) which may surround the semiconductor die used in the packaging of the die, or the quality of the bond between the semiconductor die and a substrate to which the semiconductor die may be mounted by a die attach adhesive (such as an epoxy adhesive). The failure to form a high quality bond may then result in interfacial delamination between the back side surface of the semiconductor die and either the encapsulation compound or the die attach adhesive. Thereafter, moisture absorbed into either the encapsulation compound or the die attach adhesive may collect in the delaminated areas where subsequent higher temperatures can convert the moisture to steam. The formation of steam may crack either the encapsulation compound or die attach adhesive or further delaminate the semiconductor die from either the encapsulation compound or die attach adhesive.

Furthermore, interfacial delamination caused by the lack of a high quality bond may be exacerbated by thermal mismatch due to differing coefficients of thermal expansion ("CTE") between the semiconductor die and either the encapsulation compound or the die attach adhesive. As the semiconductor die is thermally cycled by heating and cooling during fabrication processes, the interfacial delamination causes a high stress concentration in any encapsulation compound (particularly at a corners thereof) or the die attach adhesive which, in turn, can cause cracks. Once cracks are formed in either the encapsulation compound or die attach adhesive, the semiconductor package is susceptible to contamination which can render the semiconductor die inoperative.

Moreover, as higher performance, lower cost, increased miniaturization of components and greater packaging density of semiconductor die occur, related semiconductor die problems increase, such as package cracking, contamination, poor semiconductor die-to-encapsulation compound adhesion, and poor semiconductor die-to-substrate adhesion.

In an effort to combat these problems, various techniques have been suggested. Two common temporary solutions include baking the moisture out of the mold compound to ensure a low moisture content within the package, and placing the packaged semiconductor device in a "dry package" for shipping purposes. However, neither solution prevents moisture from entering the packaged semiconductor device at a later time, such as at the customer's site after the device is removed from the shipping container materials. Furthermore, these solutions do not address the CTE problems. Moreover, if the semiconductor die has delaminated even slightly in the from the encapsulation compound forming the package, the package may be subject to moisture penetration after installation causing the package to crack or delaminate when exposed to sufficient heat.

U.S. Pat. No. 5,583,372 (hereinafter "the '372 Patent"), issued to King et al., assigned to the assignee of the present invention, discloses a semiconductor die including a metal layer deposited thereon for enhancing adhesion between the semiconductor die and a mold compound (i.e., an encapsulant compound). The metal layer is substantially oxide free and provides a uniform wetting surface for better adhesion. However, the semiconductor die of the '372 Patent does not prevent or reduce contamination due to the semiconductor wafer tape. Furthermore, the '372 Patent requires additional materials and fabrication processing; specifically, depositing approximately 50 micro inches of copper on the back side surface of the semiconductor die and approximately 2 to 3 micro inches of palladium over the copper layer to form the metal layer.

U.S. Pat. No. 5,313,102 (hereinafter "the '102 Patent"), issued to Lim et al., discloses a "leads-on-chip" (hereinafter "LOC") semiconductor package device wherein a polyimide coating is placed on a back side surface of the integrated circuit prior to encapsulation to improve adhesion between the back side surface of the integrated circuit and the encapsulation compound. However, the semiconductor package device of the '102 Patent does not prevent or reduce contamination to the back side surface of the semiconductor wafer or to the polyimide coating due to the semiconductor wafer tape. Moreover, the polyimide coating fails to correct shearing problems due to differing CTEs between the semiconductor wafer and die attach adhesives or encapsulants.

U.S. Pat. No. 5,756,380 (hereinafter "the '380 Patent"), issued to Berg et al., discloses a method for making moisture resistant semiconductor devices, such as a plastic ball grid array packages, having a semiconductor die attached to an organic substrate by a silicone based die attach material after undergoing a cleaning operation to remove contaminants from the back side surface of the semiconductor die and prior to encapsulation. However, the '380 Patent requires the added processing step of cleaning using an ultraviolet light and ozone cleaning operation and does not compensate for, reduce, and/or eliminate potential shearing problems or thermal mismatching problems due to materials having dissimilar CTEs.

Finally, the Amagai article, previously referenced, discloses that adhesives with a high elastic modulus (i.e. materials which could be peeled without leaving residues) eliminate semiconductor wafer tape contamination and also improve the wettability of the chip back side surface. However, usage of the new semiconductor wafer tape disclosed in the Amagai article does not compensate for nor reduce or eliminate the potential thermal mismatching problems and resultant shear forces due to materials having dissimilar CTEs.

Thus, it can be appreciated that it would be advantageous to develop a semiconductor die and a technique to fabricate the same which overcomes the problems associated with contamination by the semiconductor wafer tape, thermal mismatch, and poor back side adhesion between the back side surface of the semiconductor die and either the encapsulation compounds or die attach adhesives.

SUMMARY OF THE INVENTION

The present invention relates to a method and an apparatus for reducing or substantially eliminating delamination and cracking damage to a packaged semiconductor device assembly due to thermal mismatch and/or semiconductor wafer tape contamination, as well as subsequent cracking and moisture penetration resulting from contamination by the semiconductor wafer tape. The present invention provides a semiconductor die having a physically altered back side surface that improves adhesion between the back side surface of the die and either the die attach adhesives or encapsulation compounds and reduces or substantially eliminates shear forces acting upon the back side surface of the die due to thermal expansion materials mismatch.

An embodiment of the present invention comprises a packaged semiconductor device assembly including a semiconductor die including, in turn, an active surface and a back side surface. The back side surface of the semiconductor die exhibits a substantially non-planar texture that may be contoured in various different shapes at a variety of different depths as measured from peak-to-valley of each contour. In other words, the back side surface of the semiconductor die may exhibit, in cross-section, contours, including sinuate, square, triangular (saw tooth), and the like. The depth of the contours, from peak to valley, is generally greater than the thickness of the adhesive on the semiconductor wafer tape to be used on the semiconductor wafer from which the die is formed. The contours of the back side surface of the semiconductor die are preferably no greater than 25 microns in depth, although this dimension is not a limitation critical to the invention.

The substantially non-planar textured back side surface may be created during fabrication of the semiconductor wafer (e.g., such as during the removal of the portion of the back side of the semiconductor wafer, as previously discussed) wherein conventional processes, such as grinding and masking and etching processes, may be used to texture and shape the semiconductor wafer's back side surface. Of course, other conventional fabrication processes, such as scribing, lapping, metallizing, and the like may be used. Furthermore, the substantially non-planar textured back side surface may be formed in a variety of patterns (the features of which extend perpendicular to the back side surface of the semiconductor wafer), including, but not limited to, concentric circular patterns (i.e., the peaks and valleys comprising concentric circles), orthogonal patterns (i.e., the valleys crossing one another at right angles), spiral patterns, parallel line patterns, and the like.

The substantially non-planar textured back side surface of the semiconductor die may both reduce the amount of area contacted by semiconductor wafer tape during the semiconductor wafer dicing process and increase the contact area (i.e., surface area) of the back side surface of the individual semiconductor die available for adhesion with die attach adhesive and/or an encapsulation compound during assembly processes.

First, the amount of contact area between the back side surface of the semiconductor wafer and the semiconductor wafer tape during wafer sawing is reduced because the substantially non-planar back side surface provides only discrete, raised contact portions, rather than an entire back side surface, that may adhere to the semiconductor wafer tape. Accordingly, the substantially non-planar textured back side surface of the semiconductor die of the present invention reduces or overcomes the delamination and adhesion problems of the prior art by reducing the area actually contacting the semiconductor wafer tape. This reduced contact area decreases the susceptibility of the semiconductor die to contamination by semiconductor wafer tape residue remaining on the die which may eventually lead to both delamination and cracking due to moisture penetration and steam expansion after packaging of the die. Stated another way, substantial surface area of the back side of the die is maintained out of contact with, and thus uncontaminated by, the wafer tape.

Second, the surface area of the back side surface of the semiconductor die of the present invention contacting and adhering to die attach or encapsulation compounds is increased because the substantially non-planar back side surface provides greater surface area for contact and adhesion than is provided with conventional back side surface of a semiconductor die. Accordingly, the increased amount of surface area of the semiconductor die of the present invention that actually contacts and adheres or bonds with either conventional die attach adhesives or encapsulation compounds substantially reduces or eliminates shear stresses along the area of adhesion thereby preventing delamination. The increased surface area of the semiconductor die of the present invention also substantially reduces or eliminates CTE problems by reorienting stresses due to thermal mismatch of the materials.

It is, of course, understood that concepts of the present invention may be used with various conventional semiconductor supporting structures and packages, including leadframes as well as ceramic, metallic, and organic carrier substrates which are attached to a back side die surface, and to various and diverse die attach adhesives or encapsulation compounds.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Various views of semiconductor wafers and semiconductor dice, according to the present invention, are illustrated in drawing FIGS. 1 through 13. It should be understood that the illustrations are not meant to be actual views of any particular semiconductor wafers or dice, but are merely idealized representations, which are employed to more clearly and fully depict the present invention than would otherwise be possible. Furthermore, the various views have been greatly exaggerated so as to more clearly and fully depict the present invention. Moreover, elements common between drawing FIGS. 1 through 13 retain the same numerical designation.

Figure 1:
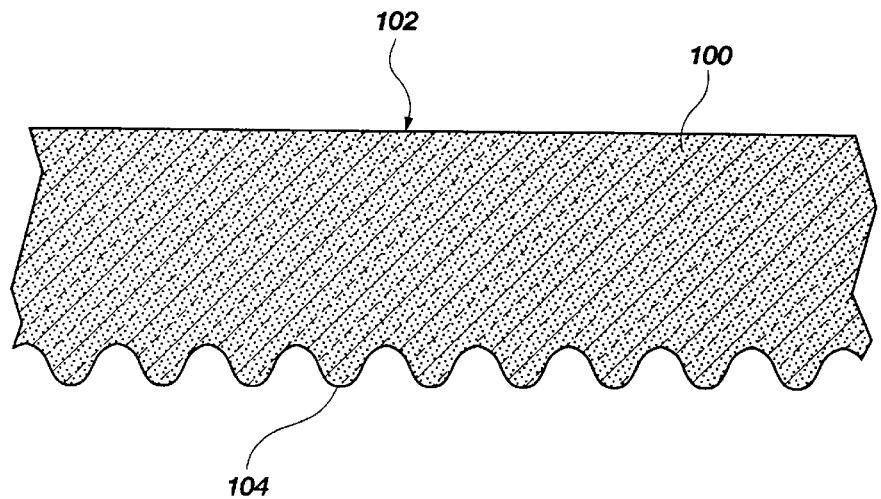
FIG. 1 is cross-sectional side view of a semiconductor die having a textured back side surface according to the present invention.

In drawing FIG. 1, illustrated is a portion of a semiconductor component 100 (such as a semiconductor wafer, a portion of a semiconductor wafer, or an individual semiconductor die) according to the present invention. The semiconductor component 100 has an active surface 102, generally including at least one integrated circuit patterned therein and/or thereon (not shown) and a back side surface 104 opposite the active surface 102. As is known in the art, the active surface 102 may have a substantially planar, uniform surface, wherein electrical interconnects, such as bond wires, TAB (conductive traces on a polymer film) connections, and so forth (not shown) may be connected to effectuate electrical connection between the semiconductor component 100 and a supporting substrate (not shown) or an external element (not shown). According to the present invention, the back side surface 104 of the semiconductor component 100 is substantially non-planar. The non-planar texture of back side surface 104, shown in drawing FIG. 1, is substantially sinusoidal in cross-section.

Figure 2:
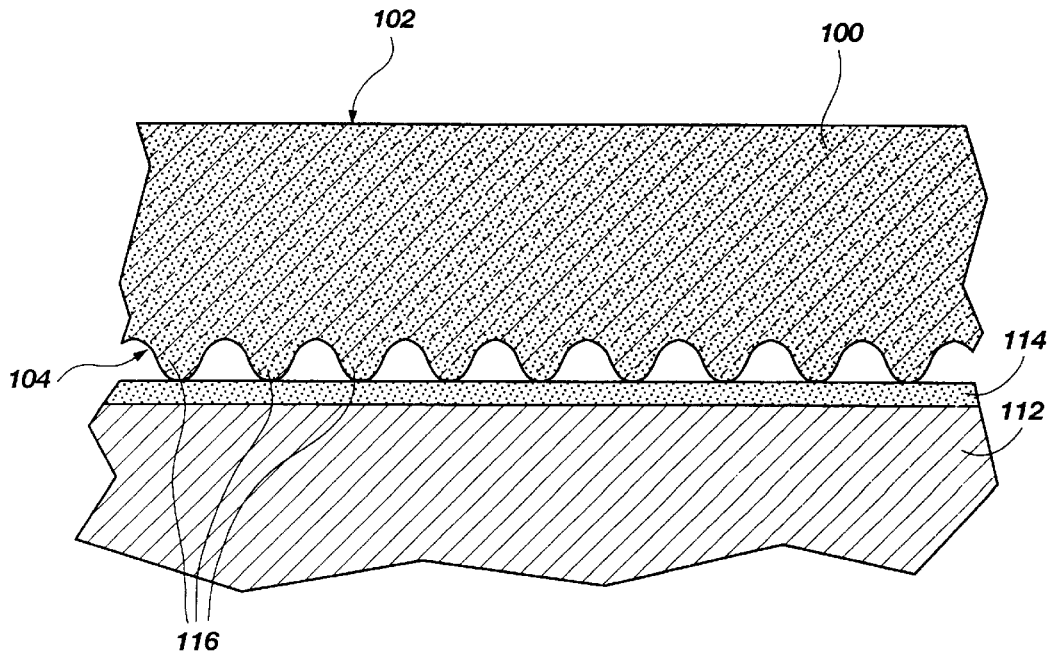
FIG. 2 is a cross-sectional side view of a semiconductor wafer having a textured back side surface contacting a conventional semiconductor wafer tape at discrete, raised contact points on the textured back side surface, according to the present invention.

In drawing FIG. 2, illustrated is the substantially non-planar back side surface 104 of the semiconductor component 100, attached to a surface 112 by semiconductor wafer tape 114. The substantially non-planar back side surface 104 provides discrete, raised contact portions 116 which adhere to the semiconductor wafer tape 114, rather than an entire back side surface 104, as is conventionally used. Thus, the reduced contact area provided by the raised contact portions 116 reduces the surface area which may potentially be contaminated by the semiconductor wafer tape 114.

Figure 3A:
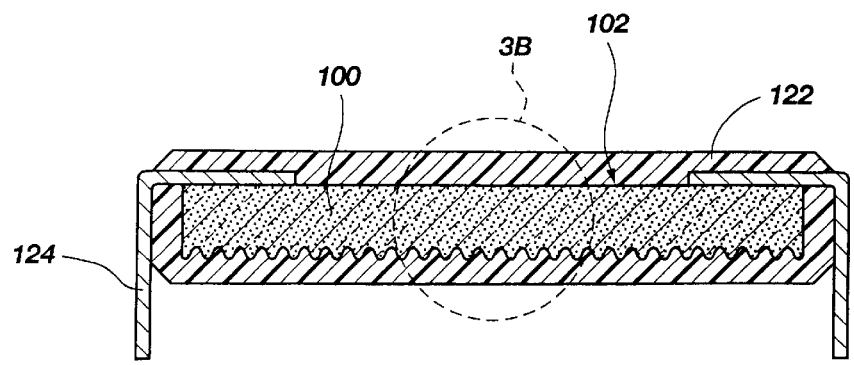
FIG. 3A is a cross-sectional side view of a semiconductor die capsulated in an encapsulant material, according to the present invention.

In drawing FIG. 3A, illustrated is a cross-section of a semiconductor component 100 which may comprise, for example, a die or partial wafer encapsulated by an encapsulation compound 122 with lead fingers 124 in electrical communication with electrical contacts such as bond pads (not shown) on an active surface 102 of the semiconductor component 100 and which extend out of the encapsulation compound 122. The encapsulation compound 122 may include, but is not limited to, epoxies, silicones, silicone-carbon resins polyimides, polyurethanes, thermoset resins, and the like.

Figure 3B:
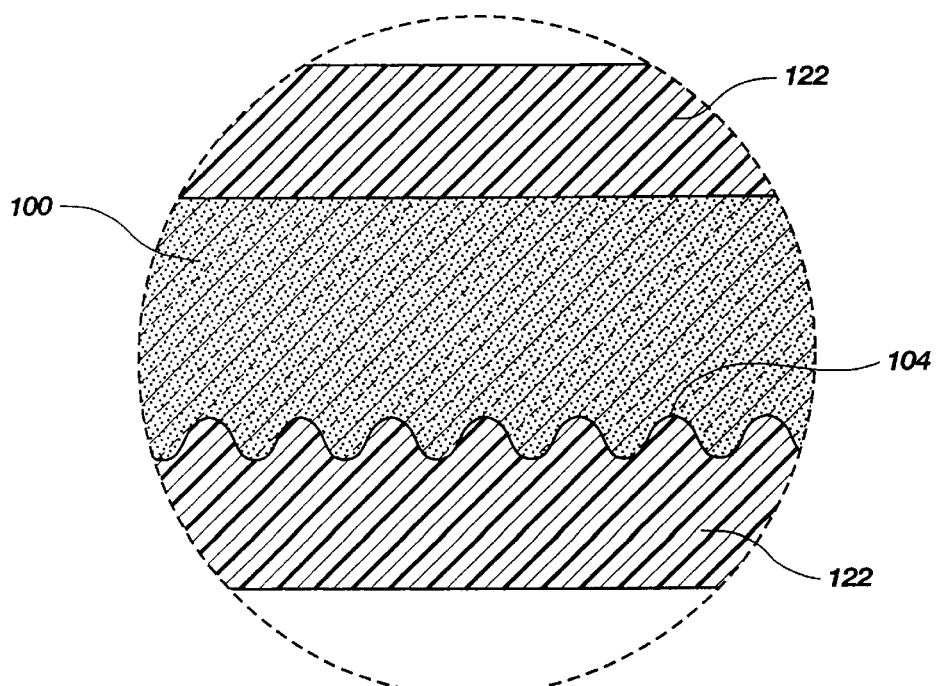
FIG. 3B is a cross-sectional side view enlargement of inset 3B of FIG. 3A, according to the present invention.

Illustrated in drawing FIG. 3B is an enlargement of inset 3B of drawing FIG. 3A. As drawing FIG. 3B illustrates, the substantially non-planar back side surface 104 of the semiconductor component 100 provides an increased contact area for adhesion with the encapsulation compound 122. The substantially non-planar character of the back side surface 104 of the semiconductor component 100 improves adhesion between the back side surface 104 of the semiconductor component 100 and the encapsulation compound 122 in several ways. First, the substantially non-planar character of the back side surface 104 increases contact surface area, which provides a greater surface area for adhesion to the encapsulation compound 122. Second, the substantially non-planar character of the back side surface 104 may also reduce or substantially eliminate shear forces along the interface between the encapsulation compound 122 and the non-parallel back side surface 104 by reorienting the shear forces in various directions and decreasing their overall effect. Finally, the substantially non-planar character of the back side surface 104 may decrease the effects of CTE mismatch by providing extra mechanical-interlock support and, in effect, reorient the shear forces so that the stresses become principle or normal stresses that act upon, rather than along, the back side surface 104.

Figure 4A:
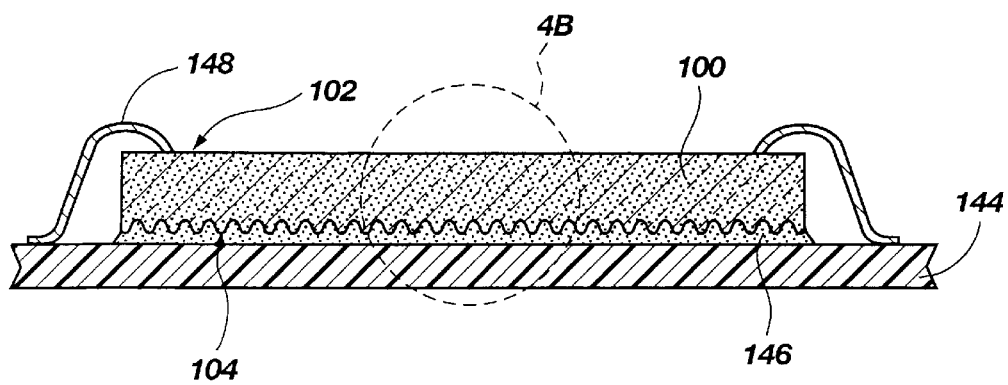
FIG. 4A is a cross-sectional side view of a semiconductor die attached to a substrate with a die attach adhesive, according to the present invention.

In drawing FIG. 4A, illustrated is a cross-section of the back side surface 104 of a semiconductor component 100 mounted to a carrier substrate 144, such as a printed circuit board, with die attach adhesive 146, wherein bond wires 148 form an electrical connection between electrical contacts, such as bond pads (not shown), of an active surface 102 of the semiconductor component 100 and electrical contacts, such as traces (not shown), on the carrier substrate 144. Die attach adhesives 146 may be conductive or non-conductive and may include, but are not limited to, epoxy adhesives, polyimide adhesive pastes, silicone materials and gels, and the like.

Figure 4B:
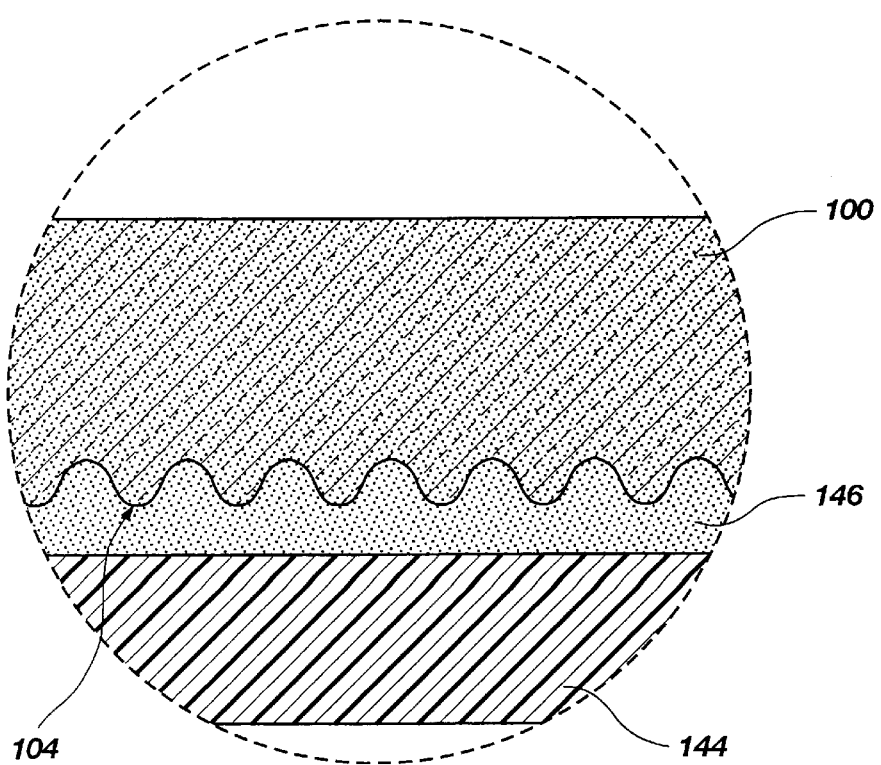
FIG. 4B is a cross-sectional side view enlargement of inset 4B of FIG. 4A, according to the present invention.

Illustrated in drawing FIG. 4B is an enlargement of inset 4B of drawing FIG. 4A. As drawing FIG. 4B illustrates, the substantially non-planar back side surface 104 of the semiconductor component 100 provides an increased contact area for adhesion with the die attach adhesive 146. The substantially non-planar character of the back side surface 104 of the semiconductor component 100 improves adhesion between the back side surface 104 of the semiconductor component 100 and the die attach adhesive 146 by the same mechanisms as discussed for drawing FIG. 3B.

Figure 5:
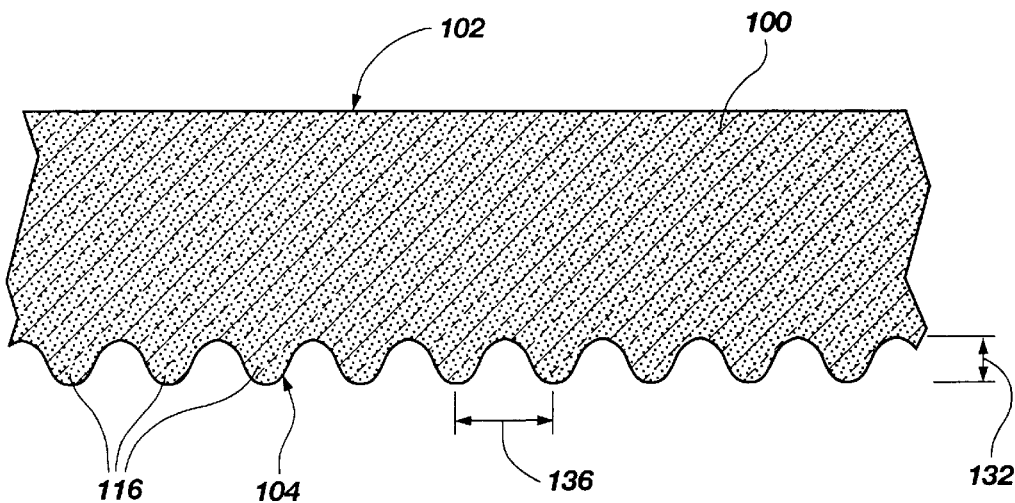
FIG. 5 is a cross-sectional side view of a semiconductor die having a textured back side surface according to the present invention.
Figure 6:
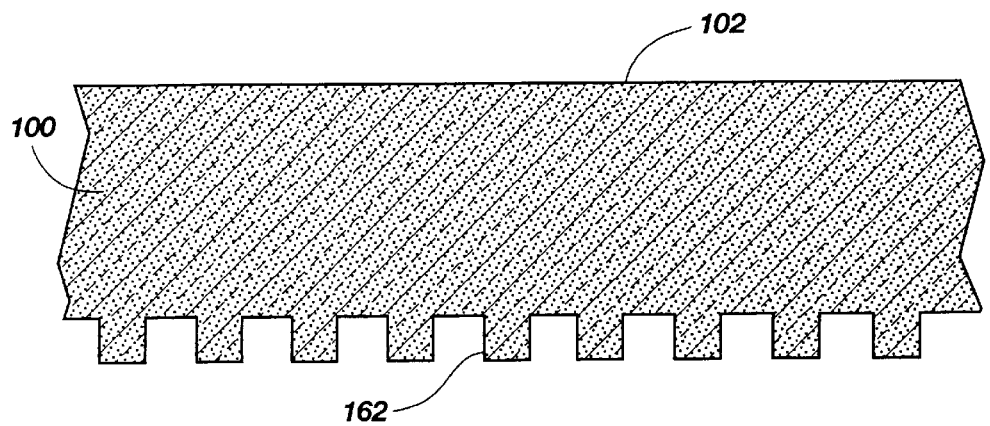
FIG. 6 is a cross-sectional side view of a semiconductor die having a square texture on a back side surface thereof, according the present invention.
Figure 7:
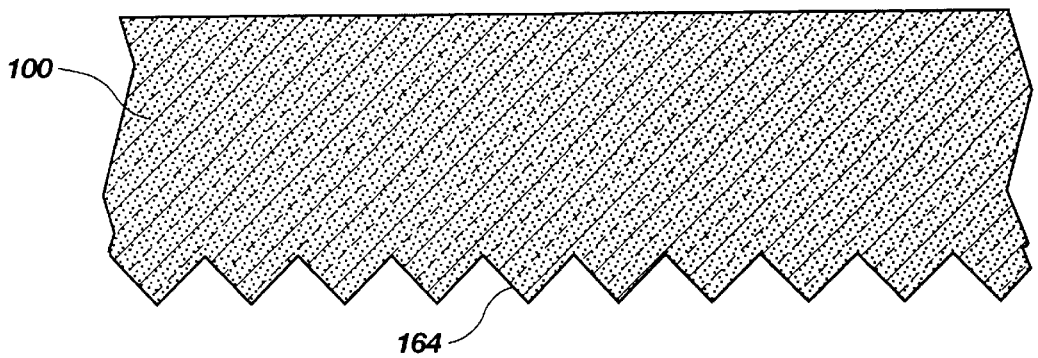
FIG. 7 is a cross-sectional side view of a semiconductor die having a triangular texture on a back side surface thereof, according to the present invention.
Figure 8:
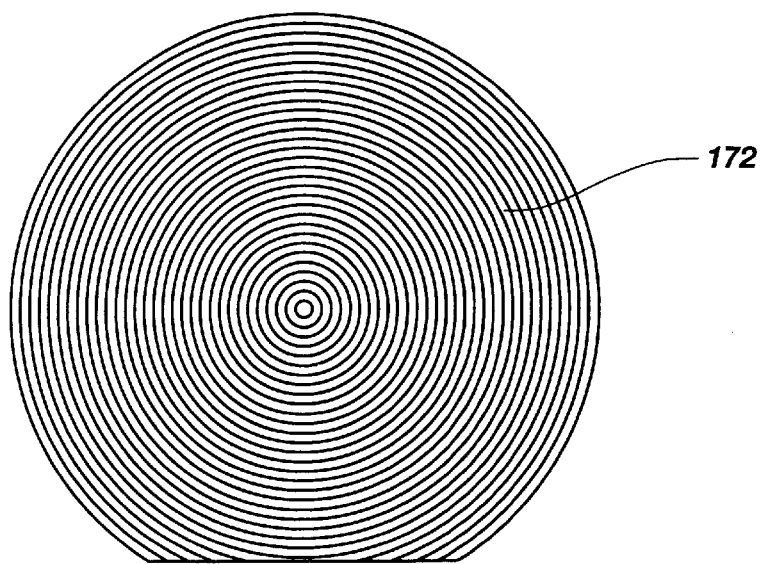
FIG. 8 is a plan view of the back side surface of a semiconductor wafer having a concentric circular pattern, according to the present invention.
Figure 9:
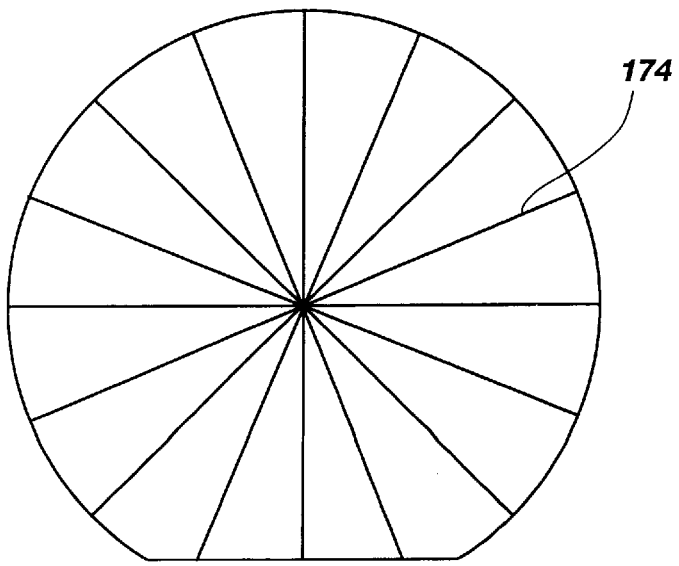
FIG. 9 is a plan view of the back side surface of a semiconductor wafer having a pie-shaped pattern, according to the present invention.
Figure 10:
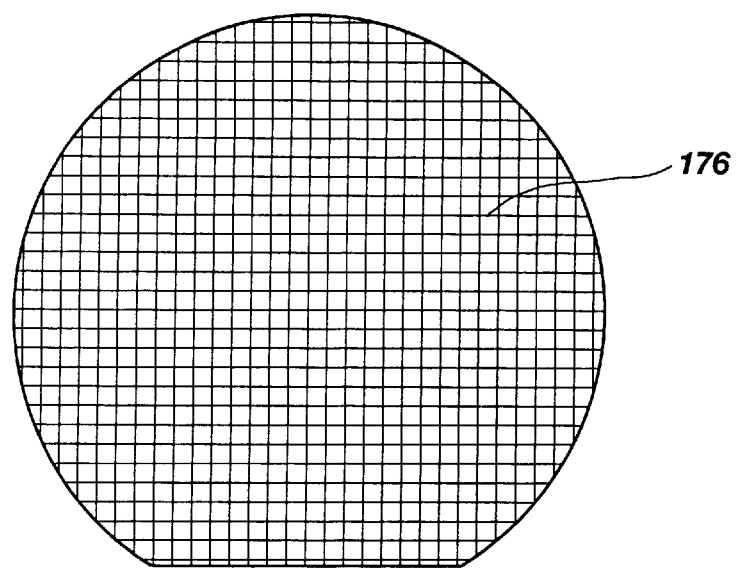
FIG. 10 is a plan view of the back side surface of a semiconductor wafer having a square pattern, according to the present invention.
Figure 11:
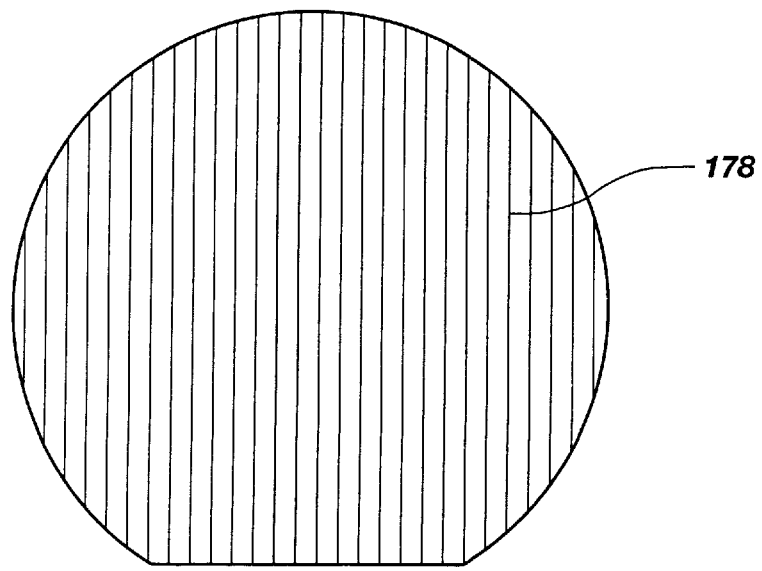
FIG. 11 is a plan view of the back side surface of a semiconductor wafer having a parallel pattern, according to the present invention.
Figure 12:
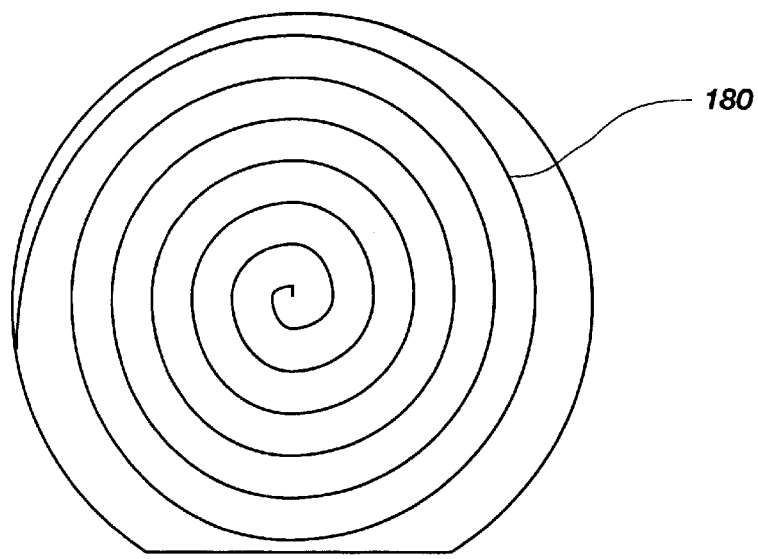
FIG. 12 is a plan view of the back side surface of a semiconductor wafer having a spiral pattern, according to the present invention.
Figure 13:
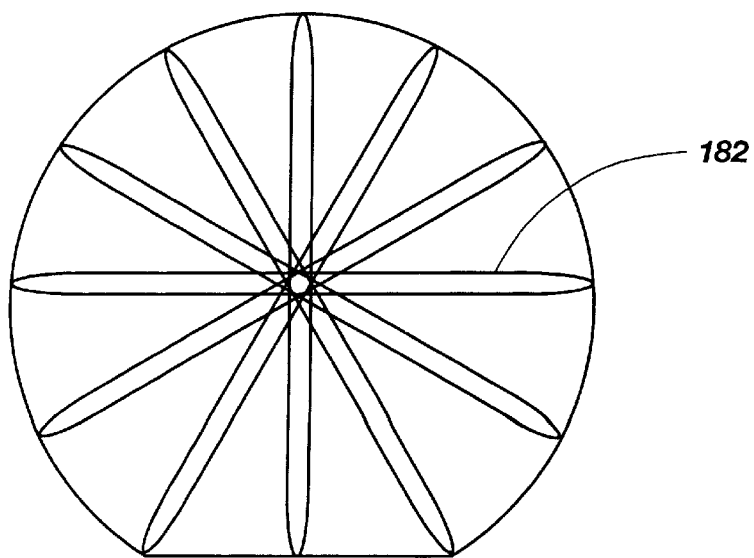
FIG. 13 is a plan view of the back side surface of a semiconductor wafer having a multiple ellipse pattern, according to the present invention.

Referring to drawing FIG. 5, the back side surface 104 of the semiconductor component 100 of the present invention preferably has a roughness or texture having a flatness value, ranging from about 5 $\mu$mm to about 25 $\mu$m. The flatness value is measured by the average of the amplitudes 132 (i.e., average peak-to-valley difference) of the texture of the back side surface 104. In addition, the distance 136 between successive raised contact portions 116 (peak-to-peak or valley-to-valley) is preferably in the same range as the flatness value for the roughness or texture of the semiconductor component 100. That is, for a roughness or texture having a flatness value ranging from about 5 $\mu$m to 25 $\mu$m, the distance 136 would also be in the range from about 5 $\mu$m to 25 $\mu$m.

Although the substantially non-planar back side surfaces 104 in drawing FIGS. 1 through 4B are illustrated as having a wavy or sinusoidal form or contour to define the raised contact portions 116, a back side surface 104 of a semiconductor component 100 may have various substantially non-planar back side surfaces 104. Illustrative examples of different backside textures include back side surfaces 104 having a square transverse cross-section 162 (as shown in drawing FIG. 6), a triangular (or sawtooth) transverse cross-section 164 (as shown in drawing FIG. 7), or other contours, so long as the textures satisfy the purposes of the present invention. It is, of course, not intended that the back side surface 104 of the semiconductor component 100 of the present invention be limited to the textures illustrated herein.

The process of forming the substantially non-planar back side surface 104 of the semiconductor component 100 may begin during preparation and fabrication of a semiconductor wafer. As previously discussed, semiconductor wafers may be sliced from a crystal ingot or formed by layering a semiconducting material on a support structure, as known in the art. As also previously discussed, semiconductor wafers are generally initially thicker than desired to minimize potential warpage and/or breakage during formation of integrated circuitry patterns on the active surface of the semiconductor wafer. After the formation of the integrated circuitry patterns, the semiconductor wafer is thinned by typically grinding or otherwise removing a portion of the back side of the semiconductor wafer. After the thinning process, the back side of the semiconductor wafer will exhibit an irregular roughness thereover depending upon the process operation. Preferably, the back side of the semiconductor wafer, although somewhat rough, is substantially planar, such that after thinning, the inherent peaks and recesses of the semiconductor back side surface lie in substantially the same plane.

After thinning, the back side of the semiconductor wafer is then textured. The texturing of the semiconductor wafer back side imparts a substantially non-planar back side surface 104, as previously discussed. The texturing may be achieved by a number of known mechanical and/or chemical processes. For example, the mechanical processes may include, but are not limited to, grinding, backgrinding, engraving, or scribing the back side surface 104 of the semiconductor wafer along a defined pattern or direction and to the extent or depth necessary to create the necessary flatness value and texture. The chemical processes may include, for example, a photolithographic masking and etching process. Photolithographic masking and etching processes are techniques well know in art. The photolithographic masking allows the formation of a defined pattern on the back side surface 104 of the semiconductor wafer. The etching process etches into the back side surface 104 of the semiconductor wafer to create the necessary flatness value and texture.

The patterns of raised contact portions 116 and corresponding valleys therebetween formed in the back side surface 104 of the semiconductor wafer may be a variety of shapes and designs, so long as the pattern that satisfies the purposes of the present invention. For example, the pattern in the semiconductor wafer may be a concentric circular pattern 172 (as shown in drawing FIG. 8), a pattern of pie-slice shaped wedges about a central point 174 (as shown in drawing FIG. 9), a pattern comprising a plurality of rectangles, preferably squares 176 (as shown in drawing FIG. 10), a pattern of mutually parallel lines 178 (as shown in drawing FIG. 11), a spiral pattern 180 (as shown in drawing FIG. 12), as well as other simple or complex geometric patterns, such as the geometric pattern 182 (multiple ellipse pattern) (as shown in drawing FIG. 13).

It should be recognized that combinations of the foregoing patterns may be utilized, and that the patterns may be selected and implemented so as to provide a certain percentage of protruding surface area to ensure adequate adhesion of semiconductor component 100 to the semiconductor wafer tape 114, while minimizing the protruding surface area to reduce the potential for contamination by the constituents of the tape. Likewise, the distribution of the raised contact area may be selected to provide adequate adhesion of all portions of the wafer back side 104 to wafer tape 114 and to ensure an adequate enhancement of surface area on the back side of each wafer sub-component (such as a die or partial wafer) after singulation for enhanced adherence of an encapsulation compound or die attach adhesive.

Once the back side surface 104 of the semiconductor wafer has been textured, according to the principles of the present invention, and has undergone other conventional fabrication processes, the textured, fabricated semiconductor wafer may then proceed to conventional assembly processes, wherein the textured, fabricated semiconductor wafer may be attached to a surface with semiconductor wafer tape (as illustrated in drawing FIG. 2) and sawed to separate the semiconductor wafer into individual semiconductor components 100. The individual semiconductor components 100 may then be encapsulated (as illustrated in drawing FIGS. 3A and 3B) or attached to various conventional semiconductor substrates and supporting structures (as illustrated in drawing FIGS. 4A and 4B). Accordingly, by way of illustration, the semiconductor component 100 of the present invention may be attached to leadframes and to ceramic, metallic, or organic substrates.

Having thus described in detail preferred embodiments of the present invention, it is to be understood that the invention defined by the appended claims is not to be limited by particular details set forth in the above description, as many apparent variations of the present invention are possible without departing from the spirit or scope of the claims.

What is claimed is:

1. A semiconductor component assembly, comprising:
   a semiconductor component comprising an active surface and a back side surface, said back side surface having a substantially non-planar texture wherein said substantially non-planar texture of the back side surface has a peak to valley amplitude measuring between about 5 μm and 25 μm.

2. The semiconductor component assembly of claim 1, wherein said semiconductor component is a semiconductor wafer.

3. The semiconductor component assembly of claim 1, wherein said semiconductor component is either a singulated semiconductor die or a partial wafer comprising a plurality of semiconductor die locations.

4. The semiconductor component assembly of claim 1, wherein the substantially non-planar texture of the back side surface has a sinuate cross-sectional contour.

5. The semiconductor component assembly of claim 1, wherein the substantially non-planar texture of the back side surface has a saw-tooth cross-sectional contour.

6. The semiconductor component assembly of claim 1, wherein the substantially non-planar texture of the back side surface has a square cross-sectional contour.

7. The semiconductor component assembly of claim 1, wherein the substantially non-planar texture of the back side surface has a contour of geometric cross-sectional configuration.

8. The semiconductor component assembly of claim 1, wherein the substantially non-planar texture of the back side surface has cross-sectional contour of irregular configuration.

9. The semiconductor component assembly of claim 1, wherein the substantially non-planar texture of the back side surface has a peak to peak amplitude measuring between about 5 μm and 25 μm.

10. The semiconductor component assembly of claim 1, wherein the substantially non-planar texture of the back side surface has a valley to valley amplitude measuring between about 5 μm and 25 μm.

11. The semiconductor component assembly of claim 1, wherein the substantially non-planar texture of the back side surface is formed of a plurality of substantially concentric circles.

12. The semiconductor component assembly of claim 1, wherein the substantially non-planar texture of the back side surface is formed in a pattern of wedges about a central point.

13. The semiconductor component assembly of claim 1, wherein the substantially non-planar texture of the back side surface is formed in a pattern comprising a plurality of rectangles.

14. The semiconductor component assembly of claim 13, wherein the substantially non-planar texture of the back side surface is formed in a pattern comprising a plurality of squares.

15. The semiconductor component assembly of claim 1, wherein the substantially non-planar texture of the back side surface is formed in a spiral pattern.

16. The semiconductor component assembly of claim 1, wherein the substantially non-planar texture of the back side surface is formed in a geometric pattern.

17. The semiconductor component assembly of claim 1, further comprising an encapsulant adhered to the back side surface in substantial conformity with the substantially non-planar texture of the back side surface.

18. The semiconductor component assembly of claim 1, further comprising:
   a carrier substrate; and
   a die attach adhesive positioned between the back side surface of said semiconductor component and said carrier substrate, said die attach adhesive being adhered to the substantially non-planar texture of the back side surface of said semiconductor component in substantial conformity therewith.

19. The semiconductor assembly of claim 18, wherein said carrier substrate is ceramic.

20. The semiconductor assembly of claim 18, wherein said carrier substrate is metallic.

21. The semiconductor assembly of claim 18, wherein said semiconductor substrate is organic.

22. A semiconductor component assembly, comprising:
   at least a portion of a semiconductor wafer including an active surface and a back side surface, said back side surface having a substantially non-planar texture; and
   wafer tape attached intermittently to portions of the back side of said at least a portion of said semiconductor wafer.

23. A semiconductor component assembly comprising:
   a plurality of singulated semiconductor dice each including an active surface and a back side surface, said back side surface having a substantially non-planar texture; and
   wafer tape attached intermittently to portions of the back side surface of said plurality of singulated semiconductor dice.

24. A method of fabricating a semiconductor component comprising:
   providing a semiconductor component having an active surface and a back side surface; and
   texturing the back side surface of said semiconductor component to create a substantially non-planar surface over the back side surface wherein said substantially non-planar surface has a peak to valley amplitude measuring between about 5 $\mu$m and 25 $\mu$m.

25. The method of claim 24, further comprising providing the semiconductor component as a semiconductor wafer.

26. The method of claim 24, further comprising providing the semiconductor component as a portion of a semiconductor wafer.

27. The method of claim 24, further comprising providing the semiconductor component with a plurality of semiconductor die locations thereon.

28. The method of claim 24, wherein texturing the back side surface further comprises grinding or scribing the back side surface.

29. The method of claim 24, wherein texturing the back side surface further comprises selectively masking and etching the back side surface.

30. The method of claim 24, wherein texturing the back side surface includes creating said substantially non-planar surface having a peak to peak amplitude between about 5 $\mu$m and 25 $\mu$m.

31. The method of claim 24, wherein texturing the back side surface includes creating said substantially non-planar surface having a valley to valley amplitude between 5 $\mu$m and 25 $\mu$m.

32. The method of claim 24, further comprising singulating the semiconductor component to define a plurality of individual semiconductor dice, each having a portion of the substantially non-planar surface on a back side thereof.

33. The method of claim 32, further comprising attaching at least some of the individual semiconductor dice by the back side thereof to a supporting structure with a die attach material in substantially continuous contact with said portion of said substantially non-planar surface.

34. The method of claim 32, further comprising at least partially encapsulating at least some of the individual semiconductor dice with an encapsulant compound disposed in substantially continuous contact with said portion of said substantially non-planar surface.

35. The method of claim 24, wherein texturing the back side surface comprises forming a predetermined pattern in the back side surface.

36. The method of claim 35, further comprising defining the predetermined pattern in a form of peaks and intervening valleys.

37. The method of claim 24, further comprising intermittently adhering the back side surface of the semiconductor component to semiconductor wafer tape.

* * * * *

UNITED STATES PATENT AND TRADEMARK OFFICE
CERTIFICATE OF CORRECTION

PATENT NO. : 6,184,064 B1
DATED : February 6, 2001
INVENTOR(S) : Tongbi Jiang and Chad A. Cobbley It is certified that error appears in the above-identified patent and that said Letters Patent is hereby corrected as shown below:

<u>Title page</u>,
Item [57], ABSTRACT,
Lines 1, 3, 6, 10 and 12, change "backside" to -- back side --
Line 2, delete the comma after "substrate"

<u>Column 3</u>,
Line 48, delete "in the"

<u>Column 9</u>,
Line 26, change "know" to -- known --

<u>Column 11</u>,
Line 35, after "side" and before "of" insert -- surface --

Signed and Sealed this

Twelfth Day of August, 2003

JAMES E. ROGAN
*Director of the United States Patent and Trademark Office*